United States Patent
Verdejo et al.

(10) Patent No.: US 8,097,969 B2
(45) Date of Patent: Jan. 17, 2012

(54) METHOD TO ESTIMATE THE OUTPUT CURRENT OF AN AUTOMOTIVE GENERATOR (ALTERNATOR)

(75) Inventors: Julian R. Verdejo, Farmington, MI (US); Michael G. Reynolds, Troy, MI (US)

(73) Assignee: GM Global Technology Operations LLC

( * ) Notice: Subject to any disclaimer, the term of this patent is extended or adjusted under 35 U.S.C. 154(b) by 691 days.

(21) Appl. No.: 12/211,306

(22) Filed: Sep. 16, 2008

(65) Prior Publication Data

US 2010/0066097 A1    Mar. 18, 2010

(51) Int. Cl.
*F02D 31/00* (2006.01)
*H02P 9/04* (2006.01)
(52) U.S. Cl. .................. 290/40 A; 290/40 R
(58) Field of Classification Search ............. 290/40 R, 290/40 A
See application file for complete search history.

(56) References Cited

U.S. PATENT DOCUMENTS

| | | | |
|---|---|---|---|
| 6,877,486 B2 * | 4/2005 | Ellies et al. | 123/478 |
| 6,962,550 B2 * | 11/2005 | Kadota | 477/15 |
| 7,342,812 B2 * | 3/2008 | Piper et al. | 363/21.16 |
| 2006/0287806 A1 * | 12/2006 | Hori | 701/114 |

FOREIGN PATENT DOCUMENTS

| JP | 2005045928 A | * | 2/2005 |
|---|---|---|---|
| JP | 2007282299 A | * | 10/2007 |

OTHER PUBLICATIONS

JP 2005045928 A Abstract Translation, East Derwent.*
JPO 2007282299 Machine Translation, Sep. 12, 2011.*

* cited by examiner

*Primary Examiner* — Quyen Leung
*Assistant Examiner* — Thomas Truong

(57) ABSTRACT

A control system of a vehicle comprises a current estimation module, a current sensor, and a current diagnostic module. The current estimation module determines an estimated output current of a generator of the vehicle based on an engine speed when the generator is operating in a steady-state condition. The current sensor measures an output current of the generator. The current diagnostic module diagnoses a condition of the current sensor based on the estimated output current and the measured output current.

18 Claims, 4 Drawing Sheets

METHOD TO ESTIMATE THE OUTPUT CURRENT OF AN AUTOMOTIVE GENERATOR (ALTERNATOR)

FIELD

The present disclosure relates to an automotive generator and more particularly to diagnosing an automotive generator.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A vehicle includes an engine and a generator. The engine combusts an air/fuel mixture within cylinders to drive pistons and a crankshaft, which produces an engine torque. The engine may output the engine torque to a generator to convert the engine torque to an electrical energy. The generator outputs the electrical energy to power components of the vehicle.

Control systems have been developed to regulate operation of the vehicle based on various vehicle operating parameters. For example, a control system may be in communication with a generator current sensor that generates a generator current signal based on an output current of the generator. The generator current signal is a critical input for the control system to determine a torque produced by a shaft of the generator. However, traditional control systems do not diagnose the generator current sensor.

SUMMARY

A control system of a vehicle comprises a current estimation module, a current sensor, and a current diagnostic module. The current estimation module determines an estimated output current of a generator of the vehicle based on an engine speed when the generator is operating in a steady-state condition. The current sensor measures an output current of the generator. The current diagnostic module diagnoses a condition of the current sensor based on the estimated output current and the measured output current.

A method of operating a control system of a vehicle comprises determining an estimated output current of a generator of the vehicle based on an engine speed when the generator is operating in a steady-state condition; measuring an output current of the generator; and diagnosing a condition of a current sensor of the generator based on the estimated output current and the measured output current.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
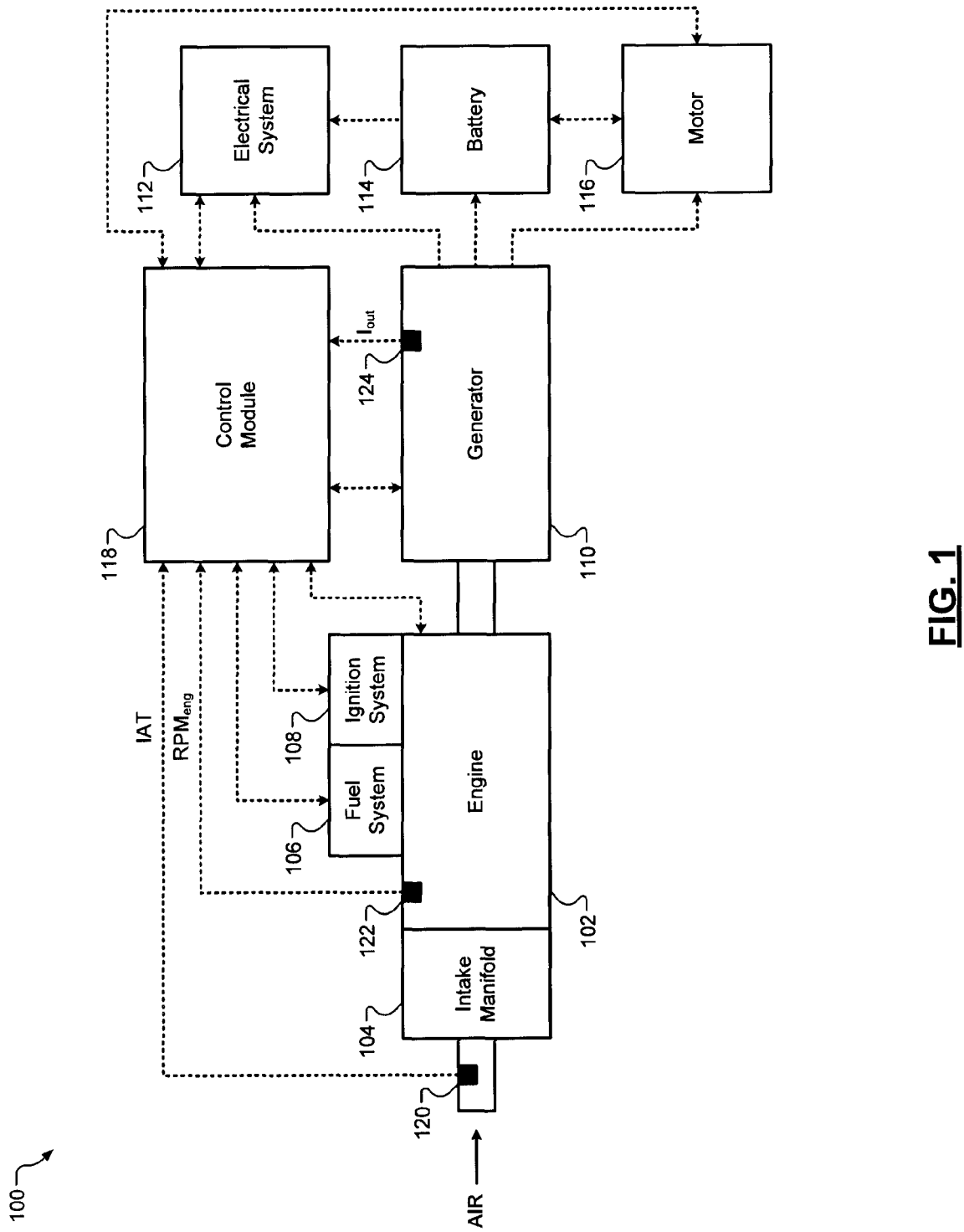
FIG. 1 is a functional block diagram of an exemplary implementation of a vehicle according to the principles of the present disclosure.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

To diagnose a generator current sensor that measures an output current of a generator of a vehicle, the control system of the present disclosure estimates the output current. The control system estimates the output current based on various generator operating parameters when the generator is operating in a steady-state (or a near steady-state) condition. The control system compares the measured output current to the estimated output current to determine whether the generator current sensor is operating properly.

Referring now to FIG. 1, a functional block diagram of an exemplary implementation of a vehicle 100 is shown. The vehicle 100 includes an engine 102, an intake manifold 104, a fuel system 106, an ignition system 108, a generator 110, an electrical system 112, a battery 114, and a motor 116. The vehicle 100 further includes a control module 118, an intake air temperature (IAT) sensor 120, an engine speed (RPM) sensor 122, and a generator current sensor 124.

The engine 102 combusts an air/fuel mixture to produce an engine torque. For example only, the engine 102 may include, but is not limited to, an internal combustion engine and/or a diesel engine. Air is drawn into the engine 102 through the intake manifold 104. Air from the intake manifold 104 is drawn into cylinders (not shown) of the engine 102.

The fuel system 106 may inject fuel into the intake manifold 104 at a central location or may inject fuel into the intake manifold 104 at multiple locations. Alternatively, the fuel system 106 may inject fuel directly into the cylinders. The air mixes with the injected fuel and creates the air/fuel mixture in the cylinders.

Pistons (not shown) within the cylinders compress the air/fuel mixture. The ignition system 108 ignites the air/fuel mixture. The combustion of the air/fuel mixture drives the pistons down, thereby driving a crankshaft (not shown) and producing the engine torque.

The engine 102 may output the engine torque to a transmission (not shown) to drive wheels (not shown) of the vehicle 100. The engine 102 may output the engine torque to the generator 110 to convert the engine torque to an electrical energy. The generator 110 outputs the electrical energy to power the electrical system 112, to charge the battery 114, and/or to power the motor 116.

For example only, the electrical system 112 may include, but is not limited to, a radio, headlights, windshield wipers, power windows and seats, and/or computers. The battery 114 may power the electrical system 112 and/or the motor 116. When large amounts of power are required to power the electrical system 112 and/or the motor 116, the electrical system 112 and/or the motor 116 may draw electrical energy from both the generator 110 and the battery 114. The motor 116 produces a motor torque and may convert the motor torque to an electrical energy to charge the battery 114. When large amounts of power are required to charge the battery 114, the battery may draw electrical energy from both the generator 110 and the motor 116.

The control module 118 regulates operation of the vehicle 100 based on various vehicle operating parameters. The control module 118 controls and communicates with the engine 102, the fuel system 106, the ignition system 108, the generator 110, the electrical system 112, and the motor 116. The control module 118 is further in communication with the IAT sensor 120 that generates an IAT signal based on an ambient temperature of air being drawn into the engine 102. The control module 118 is further in communication with the engine RPM sensor 122 that generates an engine RPM (i.e., $RPM_{eng}$) signal based on a speed of the engine 102. The control module 118 is further in communication with the generator current sensor 124 that generates a generator current (i.e., Iout) signal based on an output current of the generator 110.

Figure 2:
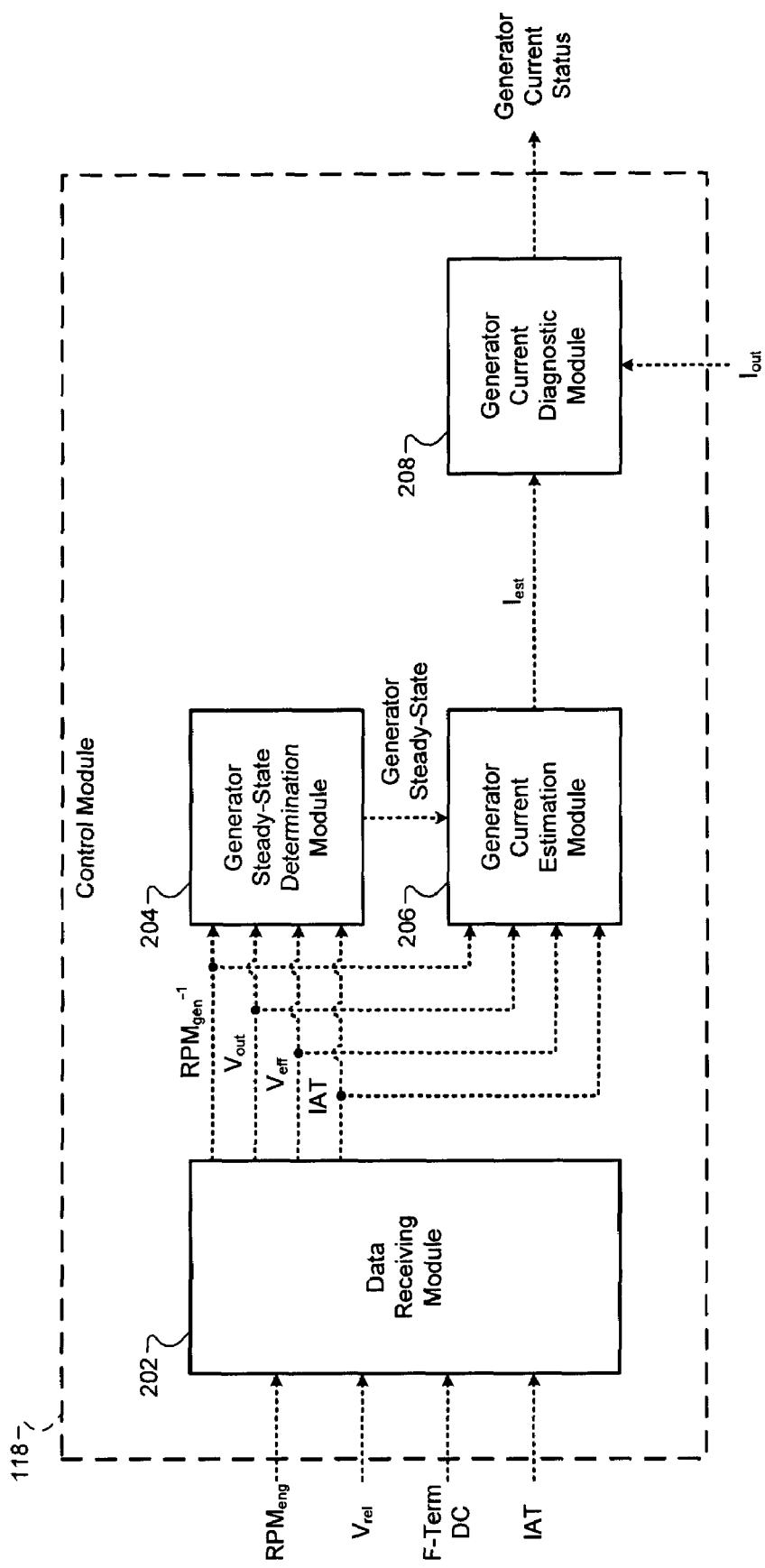
FIG. 2 is a functional block diagram of an exemplary implementation of a control module of the vehicle according to the principles of the present disclosure.

Referring now to FIG. 2, a functional block diagram of an exemplary implementation of the control module 118 of the vehicle 100 is shown. The control module 118 includes a data receiving module 202, a generator steady-state determination module 204, a generator current estimation module 206, and a generator current diagnostic module 208. The data receiving module 202 receives the engine RPM and a vehicle relay voltage (i.e., $V_{rel}$) from a relay (not shown) of the vehicle 100. The data receiving module 202 further receives a field-terminal duty cycle (i.e., F-Term DC) from the generator 110 and the IAT. The field-terminal duty cycle is an actual duty cycle of a switching voltage regulator (not shown) that selectively applies a generator voltage (i.e., an output voltage of the generator 110) to field windings (not shown) of the generator 110.

The data receiving module 202 determines a generator RPM inverse (i.e., an inverse of a speed of the generator 110). The speed of the generator 100 is determined based on multiplying the engine RPM by an engine pulley ratio. The engine pulley ratio is a predetermined ratio value of the diameters of pulleys (not shown) in the engine 102.

The data receiving module 202 determines the generator voltage based on the vehicle relay voltage. The vehicle relay voltage approximates the generator voltage. The data receiving module 202 determines an effective voltage (i.e., an average voltage applied to the field windings) based on multiplying the field-terminal duty cycle and the generator voltage. The effective voltage may be used to approximate an average field current (i.e., an average current through the field windings).

The generator steady-state determination module 204 receives the generator RPM inverse, the generator voltage, the effective voltage, and the IAT. The generator steady-state determination module 204 determines whether the generator 110 is operating in a steady-state (or a near steady-state) condition. To determine this, the generator steady-state determination module 204 determines whether the generator RPM inverse, the generator voltage, the effective voltage, and the IAT are in the steady-state condition (i.e., stable). If all of the inputs are determined to be in the steady-state condition, then the generator 110 is determined to be operating in the steady-state condition. When the generator 110 is determined to be operating in the steady-state condition, the generator steady-state determination module 204 generates a generator steady-state signal that indicates the steady-state condition.

To determine whether the inputs are in the steady-state condition, the generator steady-state determination module 204 applies a significant filter (e.g., a first-order low-pass filter) to each input. The generator steady-state determination module 204 separately applies a less significant filter (e.g., a lighter filter) to each input to get rid of any high frequency noise. The generator steady-state determination module 204 compares each heavily-filtered input to its corresponding lightly-filtered input. If the heavily-filtered input is similar to its corresponding lightly-filtered input for a predetermined time period, then the input is determined to be in the steady-state condition.

When the generator current estimation module 206 receives the generator steady-state signal, the generator current estimation module 206 is enabled. The generator current estimation module 206 receives the generator RPM inverse, the generator voltage, the effective voltage, and the IAT and determines an estimated generator current. The estimated generator current is determined based on a model that relates the estimated generator current to the generator RPM inverse, the generator voltage, the effective voltage, and the IAT. The estimated generator current is determined based on the IAT to better estimate the generator current over a wide range of temperatures of the generator 110.

The model is a least squares function that is predetermined via a linear regression based on data collected from the generator 110 while operating in the steady-state condition. Accordingly, the generator current estimation module 206 is enabled only when it receives the generator steady-state signal. The model includes a linear combination of 11 terms and 11 coefficients of the terms.

Four of the terms include the estimated generator current to the generator RPM inverse, the generator voltage, the effective voltage, and the IAT. Three of the terms include cross products of the generator RPM inverse, the generator voltage, and the effective voltage. Three of the terms include squares of the generator RPM inverse, the generator voltage, and the effective voltage. One of the terms includes a predetermined constant (i.e., an observational error).

The generator current diagnostic module 208 receives the estimated generator current and the generator current. The generator current diagnostic module 208 compares the estimated generator current to the generator current to diagnose the generator current sensor 124. For example only, the generator current sensor 124 may have failed when the generator current is 25% greater or lesser in value than the estimated generator current. For example only, the generator current diagnostic module 208 may generate a generator current status signal that indicates whether the generator current sensor 124 is operating properly. The generator current diagnostic module 208 may output the generator current status signal to an on-board diagnostics (OBD) system (not shown) of the vehicle 100.

Figure 3:
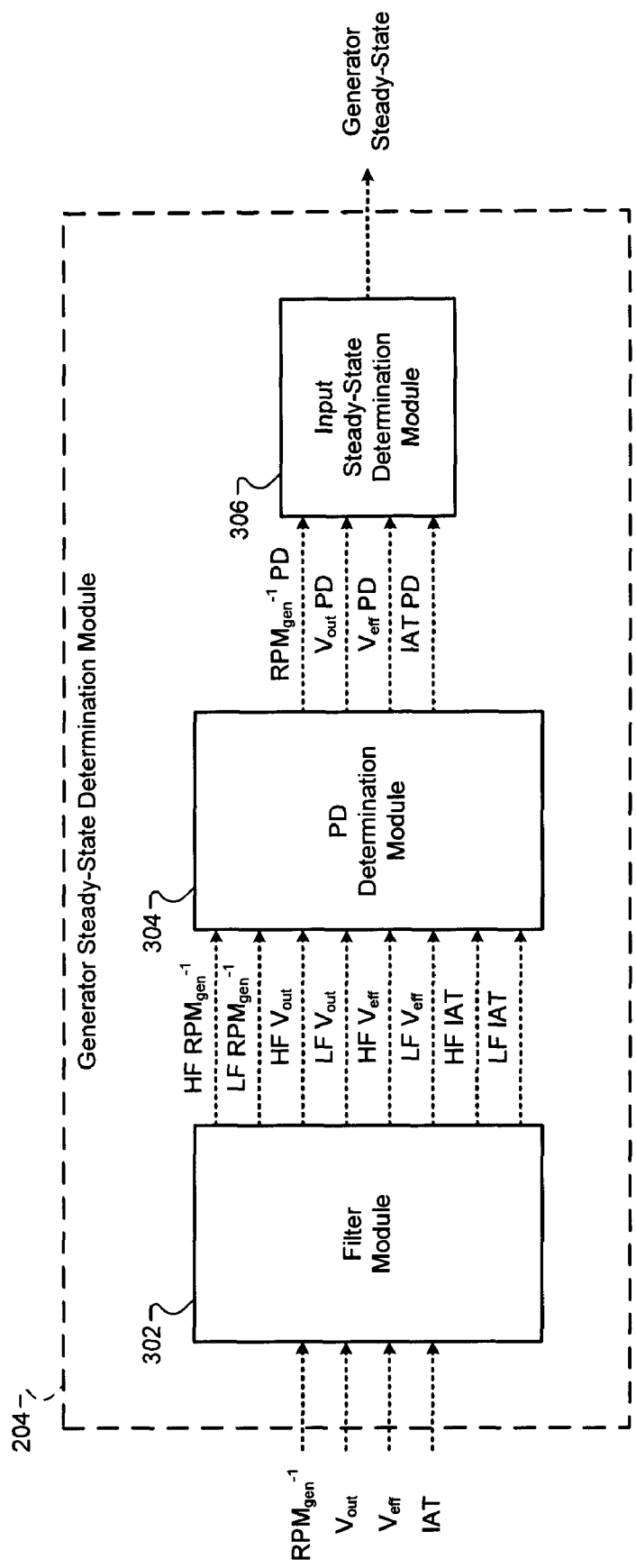
FIG. 3 is a functional block diagram of an exemplary implementation of a generator steady-state determination module according to the principles of the present disclosure.

Referring now to FIG. 3, a functional block diagram of an exemplary implementation of the generator steady-state determination module 204 is shown. The generator steady-state determination module 204 includes a filter module 302, a percentage difference (PD) determination module 304, and an input steady-state determination module 306. The filter module 302 receives the generator RPM inverse, the generator voltage, the effective voltage, and the IAT. The filter module 302 applies the significant filter to each input to determine a heavily-filtered (HF) generator RPM inverse (i.e., HF RPM$_{gen}^{-1}$), a HF generator voltage (i.e., HF V$_{out}$), a HF effective voltage (i.e., HF V$_{eff}$), and an HF IAT. The filter module 302 separately applies the less significant filter to each input to determine a lightly-filtered (LF) generator RPM inverse (i.e., LF RPM$_{gen}^{-1}$), a LF generator voltage (i.e., LF V$_{OUT}$), a LF effective voltage (i.e., LF V$_{eff}$), and an LF IAT.

The PD determination module 304 receives the HF generator RPM inverse and the LF generator RPM inverse and determines a generator RPM inverse PD based on the HF generator RPM inverse and the LF generator RPM inverse. The PD determination module 304 receives the HF generator voltage and the LF generator voltage and determines a generator voltage PD based on the HF generator voltage and the LF generator voltage. The PD determination module 304 receives the HF effective voltage and the LF effective voltage and determines an effective voltage PD based on the HF effective voltage and the LF effective voltage. The PD determination module 304 receives the HF IAT and the LF IAT and determines an IAT PD based on the HF IAT and the LF IAT.

The input steady-state determination module 306 receives the generator RPM inverse PD, the generator voltage PD, the effective voltage PD, and the IAT PD. The input steady-state determination module 306 includes a timer (not shown) and a flag (not shown) for each input. The flag indicates that the corresponding input is in the steady-state condition.

When the PD of an input is less than a predetermined value, the input steady-state determination module 306 increments the timer of the input. When the timer of the input is incremented to a value that is greater than the predetermined time period, the input steady-state determination module 306 sets the flag of the input. When the PD of the input is greater than the predetermined value, the input steady-state determination module 306 resets the timer and the flag of the input. When all of the flags of the inputs are simultaneously set, the input steady-state determination module 306 generates the generator steady-state signal.

Figure 4:
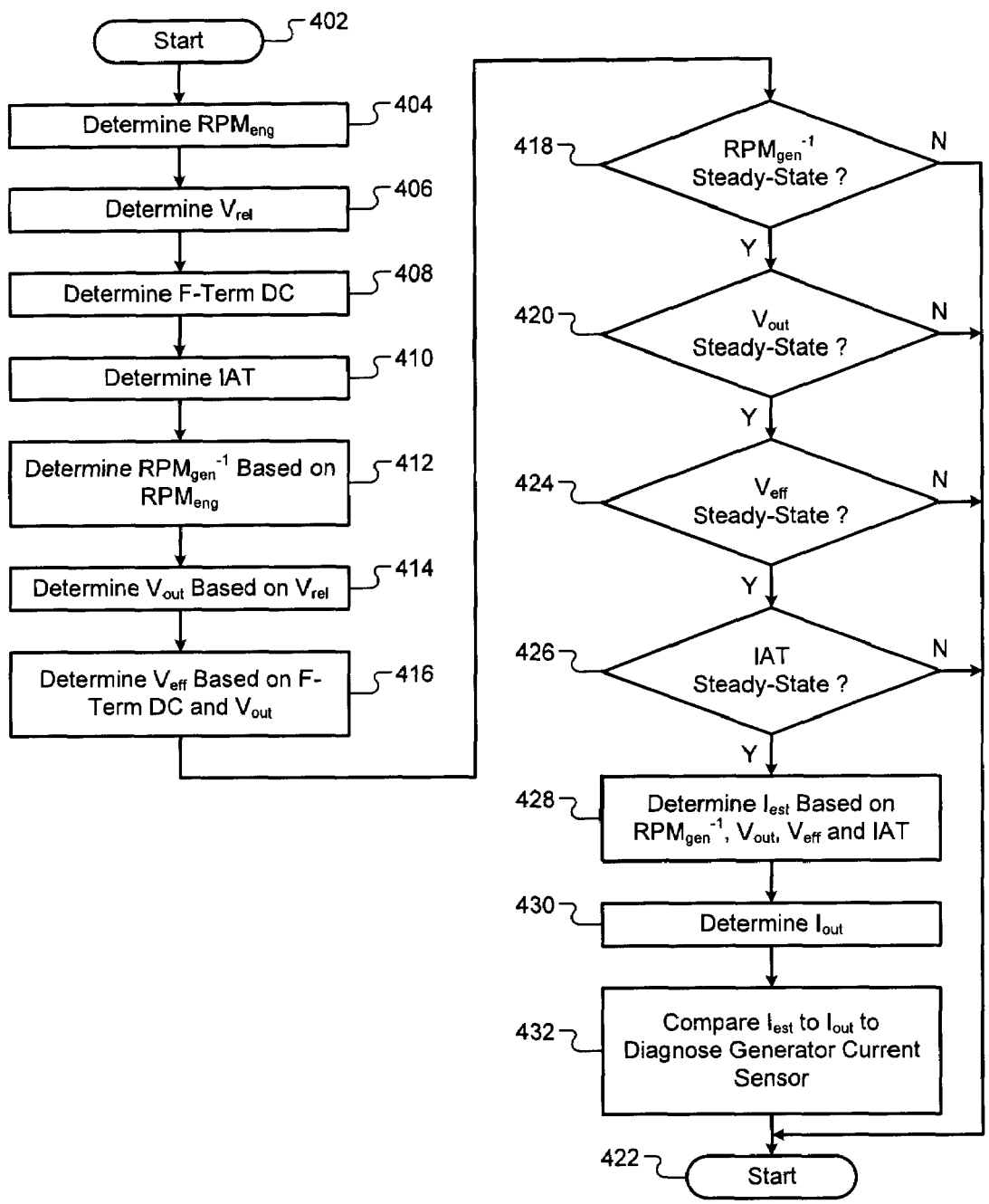
FIG. 4 is a flowchart depicting exemplary steps performed by the control module according to the principles of the present disclosure.

Referring now to FIG. 4, a flowchart depicting exemplary steps performed by the control module 118 is shown. Control begins in step 402. In step 404, the engine RPM is determined. In step 406, the vehicle relay voltage is determined. In step 408, the field-terminal duty cycle is determined.

In step 410, the IAT is determined. In step 412, the generator RPM inverse is determined based on the engine RPM. In step 414, the generator voltage is determined based on the vehicle relay voltage. In step 416, the effective voltage is determined based on the field-terminal duty cycle and the generator voltage.

In step 418, control determines whether the generator RPM inverse is in the steady-state condition. If true, control continues in step 420. If false, control continues in step 422. In step 420, control determines whether the generator voltage is in the steady-state condition. If true, control continues in step 424. If false, control continues in step 422.

In step 424, control determines whether the effective voltage is in the steady-state condition. If true, control continues in step 426. If false, control continues in step 422. In step 426, control determines whether the IAT is in the steady-state condition. If true, control continues in step 428. If false, control continues in step 422.

In step 428, the estimated generator current is determined based on the generator RPM inverse, the generator voltage, the effective voltage, and the IAT. In step 430, the generator current is determined. In step 432, the estimated generator current is compared to the generator current to diagnose the generator current sensor 124. Control ends in step 422.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A control system of a vehicle, comprising:
 a current estimation module that determines an estimated output current of a generator of the vehicle based on an engine speed when the generator is operating in a steady-state condition;
 a current sensor that measures an output current of the generator; and
 a current diagnostic module that diagnoses a condition of the current sensor based on the estimated output current and the measured output current.

2. The control system of claim 1 wherein the current estimation module determines the estimated output current based on an inverse of a generator speed.

3. The control system of claim 2 further comprising a data receiving module that determines the inverse of the generator speed based on the engine speed and an engine pulley ratio.

4. The control system of claim 2 wherein the current estimation module determines the estimated output current based on an output voltage of the generator.

5. The control system of claim 4 further comprising a data receiving module that determines the output voltage based on a vehicle relay voltage.

6. The control system of claim 4 wherein the current estimation module determines the estimated output current based on an average voltage applied to field windings of the generator.

7. The control system of claim 6 further comprising a data receiving module that determines the average voltage based on the output voltage and a duty cycle of a switching voltage regulator that applies the output voltage to the field windings.

8. The control system of claim 6 wherein the current estimation module determines the estimated output current based on an intake air temperature.

9. The control system of claim 8 further comprising a steady-state determination module that determines the generator to be operating in the steady-state condition when the inverse of the generator speed, the output voltage, the average voltage, and the intake air temperature are in the steady-state condition.

10. A method of operating a control system of a vehicle, comprising:
 determining an estimated output current of a generator of the vehicle based on an engine speed when the generator is operating in a steady-state condition;
 measuring an output current of the generator; and
 diagnosing a condition of a current sensor of the generator based on the estimated output current and the measured output current.

11. The method of claim 10 further comprising determining the estimated output current based on an inverse of a generator speed.

12. The method of claim 11 further comprising determining the inverse of the generator speed based on the engine speed and an engine pulley ratio.

13. The method of claim 11 further comprising determining the estimated output current based on an output voltage of the generator.

14. The method of claim 13 further comprising determining the output voltage based on a vehicle relay voltage.

15. The method of claim 13 further comprising determining the estimated output current based on an average voltage applied to field windings of the generator.

16. The method of claim 15 further comprising determining the average voltage based on the output voltage and a duty cycle of a switching voltage regulator that applies the output voltage to the field windings.

17. The method of claim 15 further comprising determining the estimated output current based on an intake air temperature.

18. The method of claim 17 further comprising determining the generator to be operating in the steady-state condition when the inverse of the generator speed, the output voltage, the average voltage, and the intake air temperature are in the steady-state condition.

* * * * *